US008806419B2

(12) United States Patent
Haensch et al.

(10) Patent No.: US 8,806,419 B2
(45) Date of Patent: Aug. 12, 2014

(54) APPARATUS FOR MODELING OF FINFET WIDTH QUANTIZATION

(71) Applicant: International Business Machines Corporation, Armonk, NY (US)

(72) Inventors: Wilfried Ernest-August Haensch, Somers, NY (US); Chung-Hsun Lin, White Plains, NY (US); Philip J. Oldiges, Lagrangeville, NY (US); Hailing Wang, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/970,806

(22) Filed: Aug. 20, 2013

(65) Prior Publication Data

US 2014/0201700 A1    Jul. 17, 2014

Related U.S. Application Data

(63) Continuation of application No. 13/741,490, filed on Jan. 15, 2013.

(51) Int. Cl.
    *G06F 17/50*    (2006.01)
(52) U.S. Cl.
    USPC .......................................... 716/136; 716/106
(58) Field of Classification Search
    USPC .................. 716/106–109, 132–136
    See application file for complete search history.

(56) References Cited

U.S. PATENT DOCUMENTS

| 7,009,250 | B1 | 3/2006 | Mouli |
| 7,894,927 | B2 | 2/2011 | Funk et al. |
| 2009/0302372 | A1* | 12/2009 | Chang et al. .................. 257/327 |
| 2010/0332208 | A1 | 12/2010 | Victory et al. |
| 2011/0153055 | A1 | 6/2011 | Sheu et al. |
| 2011/0233512 | A1* | 9/2011 | Yang et al. ........................ 257/9 |

OTHER PUBLICATIONS

T. Matsukawa et al., "Comprehensive anaysis of varabilty soures of FinFET characerstcs," 2009 Symposium on VLSI Technology, Jun. 16-18, 2009, pp. 118-119.
S.-I. O'Uchi et al., "Metal-Gate FinFET Variation Analysis by Measurement and Compact Model," IEEE Electron Device Letters, vol. 30, No. 5, May 2009, pp. 556-558.
S. H. Rasouli et al., "Desgn Optimzaton of FinFET Domino Logic Considering the Width Quantization Property," IEEE Transactions on Electron Devices, vol. 57, No. 11, Nov. 2010, pp. 2934-2943.

(Continued)

*Primary Examiner* — Paul Dinh
(74) *Attorney, Agent, or Firm* — Harrington & Smith (57) ABSTRACT

A method for modeling FinFET width quantization is described. The method includes fitting a FinFET model of a FinFET device to single fin current/voltage characteristics. The FinFET device comprises a plurality of fins. The method includes obtaining statistical data of at least one sample FinFET device. The statistical data includes DIBL data and SS data. The method also includes fitting the FinFET model to a variation in a current to turn off the finFETs device ($I_{OFF}$) in the statistical data using the DIBL data and the SS data and determining a model for a voltage to turn off the finFETs device ($V_{OFF}$). The method also includes fitting the FinFET model to the $V_{OFF}$.

9 Claims, 7 Drawing Sheets

(56) References Cited

OTHER PUBLICATIONS

D. D. Lu et al., "Design of FinFET SRAM Cells Using a Statistical Compact Model," International Conference on Simulation of Semiconductor Processes and Devices, SISPAD '09, Sep. 9-11, 2009, 4 pages.

D. Abrahimi et al., "Statistical Design Optimization of FinFET SRAM Using Back-Gate Voltage," IEEE Transactions on Very Large Scale Integration (VLSI) Systems, vol. 19, No. 10, Oct. 2011, pp. 1911-1916.

M. Tang et al., "Explicit Compact Model for Ultranarrow Body FinFETs," IEEE Transactions on Electron Devices, vol. 56, No. 7, Jul. 2009, pp. 1543-1547.

* cited by examiner

APPARATUS FOR MODELING OF FINFET WIDTH QUANTIZATION

CROSS REFERENCE TO RELATED APPLICATION

This application is a divisional patent application of copending application Ser. No. 13/741,490 filed Jan. 15, 2013 which is hereby incorporated by reference in its entirety.

TECHNICAL FIELD

The exemplary embodiments of this invention relate generally to field effect transistors (FETs) and, more specifically, relate to modeling FinFET width quantization.

BACKGROUND

This section is intended to provide a background or context. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Semiconductors and integrated circuit chips have become ubiquitous within many products due to their continually decreasing cost and size. In the microelectronics industry as well as in other industries involving construction of microscopic structures (such as micromachines, magnetoresistive heads, etc.) there is a continued desire to reduce the size of structural features and microelectronic devices and/or to provide a greater amount of circuitry for a given chip size. Miniaturization, in general, allows for increased performance (such as more processing per clock cycle and less heat generated for example) at lower power levels and lower cost. Current technology is at or approaching atomic level scaling of certain micro-devices such as logic gates, FETs and capacitors. Circuit chips with hundreds of millions of such devices are not uncommon. Further size reductions appear to be approaching the physical limit of trace lines and micro-devices that are embedded upon and within their semiconductor substrates.

BRIEF SUMMARY

In an exemplary aspect, a method for modeling FinFET width quantization includes: fitting a FinFET model of a FinFET device to single fin current/voltage characteristics, where the FinFET device comprises a plurality of fins; obtaining statistical data of at least one sample FinFET device, where the statistical data comprises DIBL data and SS data; fitting the FinFET model to a variation of offstate current ($I_{OFF}$) in the statistical data using the DIBL data and the SS data; determining a second-order polynomial model for the turn-off voltage (VOFF) in the compact model. The VOFF only impacts the subthreshold behaviors but not the on-state behavior of the transistor.

In another exemplary aspect, a method for modeling FinFET width quantization includes: obtaining statistical data of a FinFET device, where the statistical data comprises DIBL data and SS data, and where the FinFET device comprises a plurality of fins; defining a product fitness merit based on the DIBL data and the SS data using a single parameter statistical model; defining at least one DIBL guardband based on a product performance metric; defining at least one SS guardband based on a product performance metric; and determining a product quality of the FinFET device based at least in part on the at least one DIBL guardband, the at least one SS guardband and the product fitness merit.

In a further exemplary aspect, an article of manufacture tangibly embodying computer readable non-transitory instructions which, when implemented, cause a computer to carry out the steps of a method for modeling fin field effect transistor (FinFET) width quantization. The method includes fitting a FinFET model of a FinFET device to single fin current/voltage characteristics, where the FinFET device comprises a plurality of fins; obtaining statistical data of at least one sample FinFET device, where the statistical data comprises DIBL data and SS data; fitting the FinFET model to a variation in a current to turn off the finFETs device ($I_{OFF}$) in the statistical data using the DIBL data and the SS data; determining a second-order polynomial model for the turn-off voltage (VOFF) in the compact model. The VOFF only impacts the subthreshold behaviors but not the on-state behavior of the transistor In another exemplary aspect, an article of manufacture tangibly embodying computer readable non-transitory instructions which, when implemented, cause a computer to carry out the steps of a method for modeling fin field effect transistor (FinFET) width quantization. The method includes: obtaining statistical data of a FinFET device, where the statistical data comprises DIBL data and SS data, and where the FinFET device comprises a plurality of fins; defining a product fitness merit based on the DIBL data and the SS data using a single parameter statistical model; defining at least one DIBL guardband based on a product performance metric; defining at least one SS guardband based on a product performance metric; and determining a product quality of the FinFET device based at least in part on the at least one DIBL guardband, the at least one SS guardband and the product fitness merit.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The following abbreviations that may be found in the specification and/or the drawing figures are defined as follows:

| | |
|---|---|
| CMOS | complementary metal-oxide semiconductor |
| delvt | threshold voltage adjust |
| DIBL | drain induced barrier lowering |
| FET | field effect transistor |
| FinFET | fin-type FET |
| ILT | in-line test |
| MOS | metal-oxide semiconductor |
| NFET | n-type FET |
| PFET | p-type FET |
| Rdsw | width coefficient of parasitic resistance |
| SOI | silicon-on-insulator |
| SRAM | static random access memory |
| SS | subthreshold slope |
| Wdrawn | drawn channel width |

A field effect transistor (FET) is a transistor having a source, a gate, and a drain. The action of the FET depends on the flow of majority carriers along a channel between the source and drain that runs past the gate. Current through the channel, which is between the source and drain, may be controlled by a transverse electric field under the gate.

As known to those skilled in the art, P-type FETs (PFETs) turn ON to allow current flow between source and drain when the gate terminal is at a low or negative potential with respect to the source. When the gate potential is positive or the same as the source, the P-type FET is OFF and does not conduct current. On the other hand, N-type FETs (NFETs) turn ON to allow current flow between source and drain when the gate terminal is high or positive with respect to the source. When the gate potential is negative or the same as the source, the N-type FET is OFF and does not conduct current. Note that in each of these cases there is a threshold voltage (such as at the gate terminal) for triggering actuation of the FET.

More than one gate can be used to more effectively control the channel. The length of the gate determines how fast the FET switches, and can be about the same as the length of the channel (such as the distance between the source and drain). Multi-gate FETs are considered to be promising candidates to scale down complementary metal-oxide semiconductor (CMOS) FET technology. However, such small dimensions necessitate greater control over performance issues such as short channel effects, punch-through, metal-oxide semiconductor (MOS) leakage current and the parasitic resistance that is present in a multi-gate FET.

The channel length of FETs has been successfully reduced through the use of one or more fin-shaped channels. A FET employing such a channel structure may be referred to as a FinFET. Previously, CMOS devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

The nature of FinFET devices prohibits continuous width scaling and introduces a digitization of device width. As a consequence, devices are comprised of arrays of fins ranging from one (such as for SRAM) to a few tens of fins. This introduces an intrinsic variation in the device that is absent in conventional planar devices.

Figure 1A:
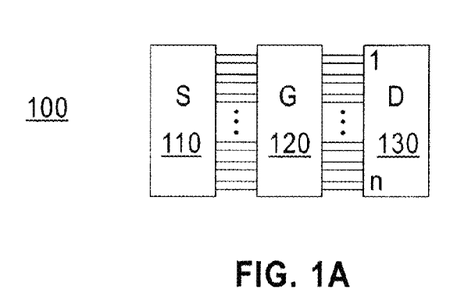
FIGS. 1A, 1B and 1C, collectively referred to as FIG. 1, illustrate the impact fin count has on statistical variation.
Figure 1B:
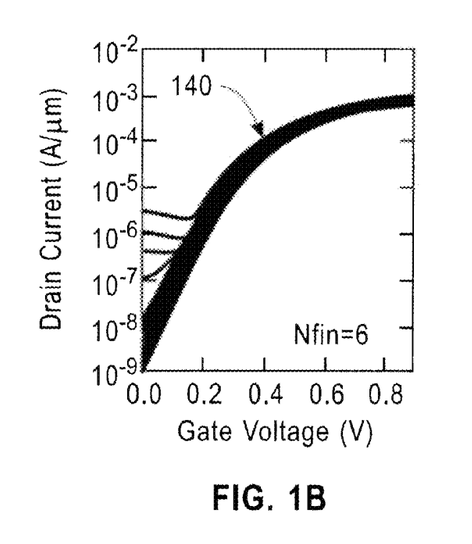
Figure 1C:
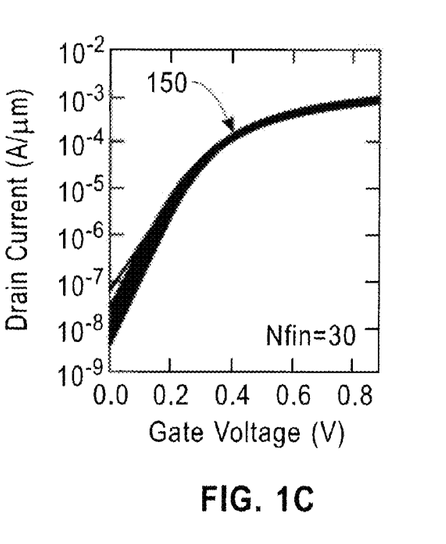

FIGS. 1A, 1B and 1C, collectively referred to as FIG. 1, illustrate the impact that fin count has on statistical variation. FIG. 1A shows a simplified block diagram of a multiple finFET device 100. The device 100 includes a number of finFETs ($N_{fin}$), n, which provide a source 110, a gate 120 and a drain 130. The width of an individual finFET ($W_{1-fin}$) is approximately twice the height of the fins ($H_{fin}$) for a double-gate finFET and twice the height of the Hfin plus the fin thickness (Dfin) for a triple-gate finFET (or Trigate). The effective width of the device 100 is $n \times W_{1-fin}$.

Statistical variation in a single fin can dominate an electrical response (such as $I_{off}$ for example) in low fin count FinFETs (Nfin=6) in contrast to high fin count FinFETs (Nfin=30). FIGS. 1B and 1C illustrate this effect.

FIG. 1B illustrates the relationship of gate voltage to drain current when there are six finFETs ($N_{fin}$=6). The graph represents data collected over a sampling of devices 100. As the curve 140 approaches a gate voltage of 0 V, variations in individual finFETs begin to impact the curve 140.

FIG. 1C illustrates the relationship of gate voltage to drain current when there are thirty finFETs ($N_{fin}$=30). As in FIG. 1B, the graph represents data collected over a sampling of devices 100. As the curve 150 approaches a gate voltage of 0 V, variations in individual finFETs also impact the curve 150; however, due to the larger number of finFETs, this effect is less pronounced.

Figure 2:
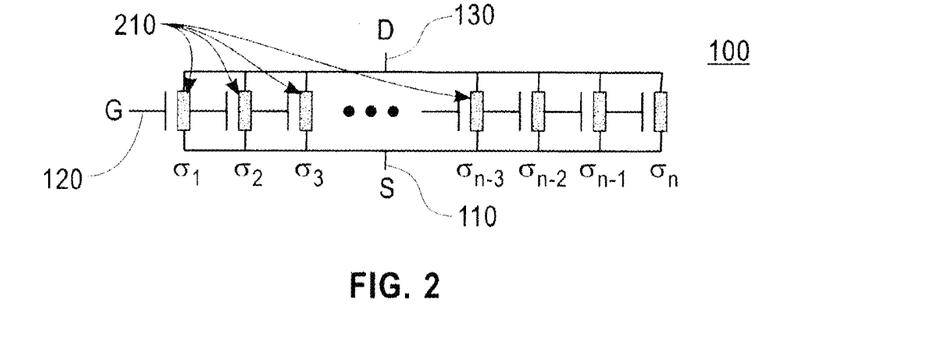
FIG. 2 shows a simplified block diagram of a circuit model using multiple discrete compact models.

FIG. 2 shows a simplified block diagram of a circuit model using multiple discrete compact models. The circuit 100 includes n individual finFETs 210. The gates 120 of all finFETs 210 are connected together. Similarly, the drains 130 are connected to each other and the sources 110 are connected to each other.

To build a reliable circuit model parameters are used which take into account the scaling behavior caused by increasing the number of fins for the composite device. Using various exemplary embodiments, composite fin behavior can be modeled correctly using a single fin model. The statistical drive current and the leakage current distribution may also be accurately modeled. Drain induced barrier lowering (DIBL) is a subthreshold relationship for the composite device which can be used as an easily accessible indicator and calibration aid for the intrinsic variations observed in a composite device.

Symmetric double-gate FinFETs are promising candidates for 22 nm and beyond manufacturing due to better short channel behaviors, such as steep subvt slope and low DIBL. The effective electrical width (Weff) in a FinFET technology is quantized depending on Wdrawn values and fin pitch. However, differences in fin thickness ($D_{fin}$) variation introduce variations in DIBL for a given fin. $D_{fin}$ variation is a major source of variation in fully-depleted FinFETs with many fins because $D_{fin}$ variation in a single fin can significantly dominate composite transistor properties such as $I_{off}$.

Technology improvements can reduce fin thickness but circuit designers ultimately need efficient and accurate methods for compact modeling for any residual variation. Additionally, rapid testing may be used to assess product quality during a manufacturing inline test (ILT).

Statistical hardware data trends to be modeled may include the voltage threshold caused by DIBL ($V_{th,DIBL}$). The number of fins ($N_{fin}$) influences the variation in the voltage threshold caused by DIBL ($\sigma_{V_{th,DIBL}}$) such that regardless of the process used, $\sigma_{V_{th,DIBL}}$ [N fins] increases as $N_{fin}$ approaches 1 (similar to as seen in FIGS. 1B and 1C), as shown by the following equation:

$$\sigma_{V_{th,DIBL}}[N \text{ fins}] = \frac{\sigma_{V_{th,DIBL}}[1 \text{ fins}]}{\sqrt{N_{fin}}}. \tag{1}$$

Figure 3:
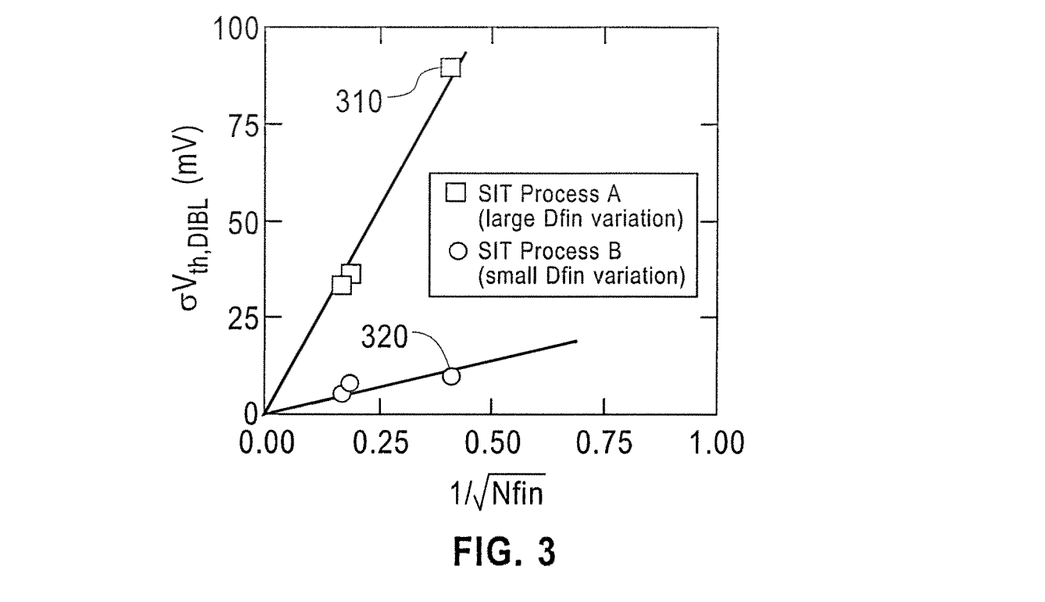
FIG. 3 illustrates the relationship of fin count to the variation in DIBL voltage threshold.

FIG. 3 illustrates the relationship of fin count to the variation in DIBL voltage threshold. The $V_{th,DIBL}$ is compared for two processes: process A, where the variation between individual fin thicknesses ($D_{fin}$) is large; and process B, where the variation in $D_{fin}$ is small. As shown, line 320 shows a slower change in the variation in the voltage threshold is seen as the number of fin decrease when the variation in $D_{fin}$ is small (process B). In contrast, line 310 shows a much faster growth in $\sigma_{V_{th,DIDL}}$ [N fins] when the variation in $D_{fin}$ is large (process A). Thus, when $N_{fin}$ is small any variation in $D_{fin}$ plays a greater role in the variation in the voltage threshold caused by DIBL. By extension, variations in $D_{fin}$ play a less significant role when there is a larger number of finFETs.

Figure 4:
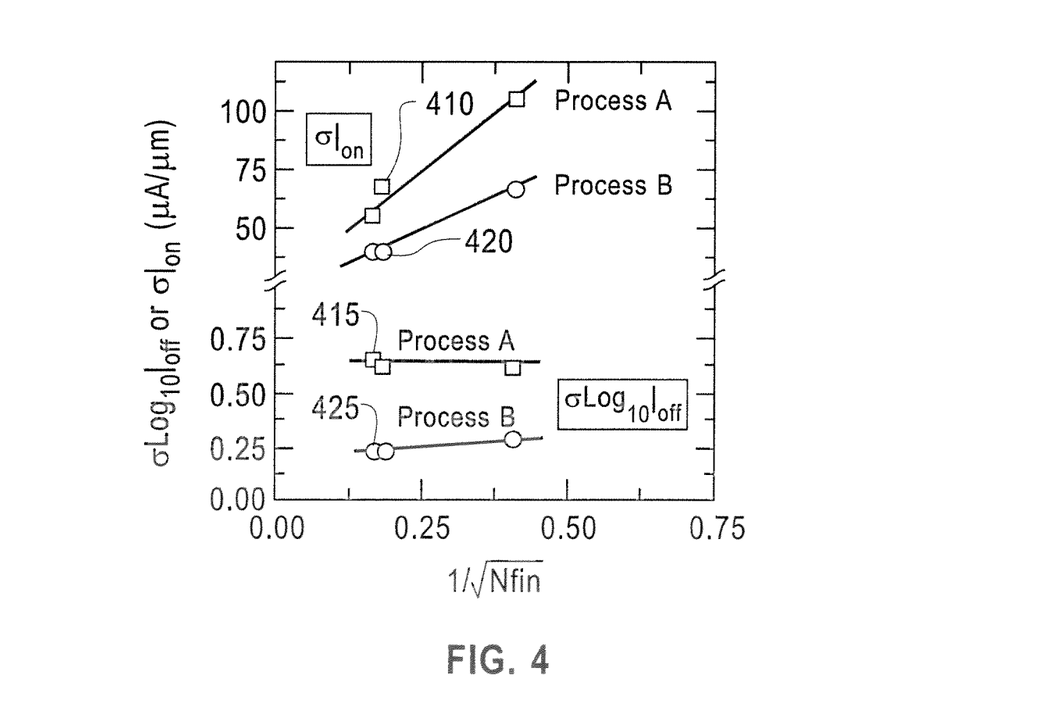
FIG. 4 illustrates the relationship of fin count to variation in $I_{off}$ and to variation in $I_{on}$.

FIG. 4 illustrates the relationship of fin count to variation in current to turn off the finFETs device ($I_{off}$) and to variation in current to turn on the finFETs device ($I_{on}$). As shown, the line 410 shows the variation in $I_{on}$ for process A (where variation in $D_{fin}$ is large) and line 420 shows the variation in $I_{on}$ for process B. Both lines 410 and 420 vary linearly in $$\frac{1}{\sqrt{N_{fin}}}.$$

Line 415 shows the variation in $I_{off}$ for process B and line 425 shows the variation in $I_{off}$ for process A. Because $I_{off}$ of line 415 is dominated by the worst fin (thickest) in the array of fins, low of line 415 does not vary exponentially in $$\frac{1}{\sqrt{N_{fin}}}.$$

Hardware statistical trends can be modeled for multiple fin devices and compared with single fin devices. The dispersion in DIBL may be compared against sub-threshold slope (SS) in order to establish a metric of $\sigma_{D_{fin}}$ variability in multi-fin structures.

Figure 5:
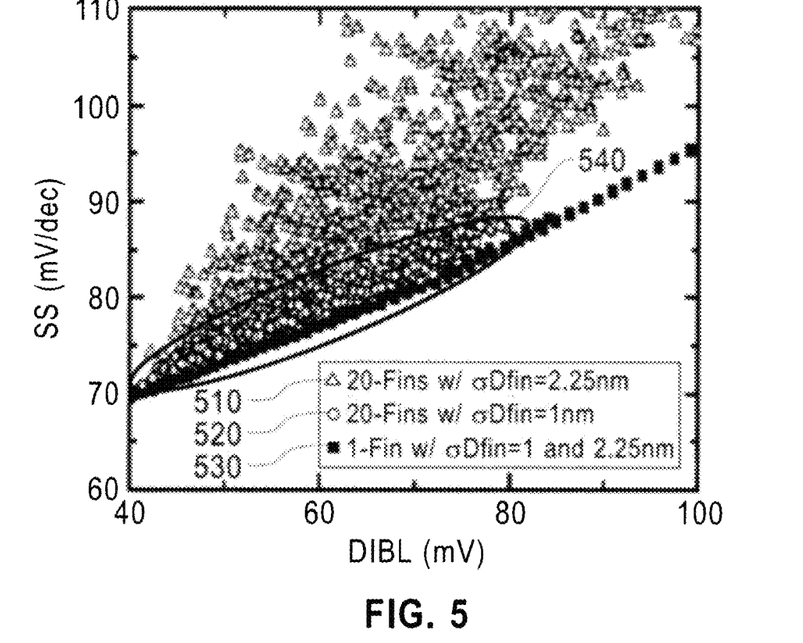
FIG. 5 demonstrates the DIBL vs. subthreshold slope (SS) of various devices with different $N_{fin}$ and variations in $D_{fin}$.

FIG. 5 demonstrates the DIBL vs. subthreshold slope (SS) of various devices with different variation in $D_{fin}$ ($\sigma_{D_{fin}}$) and $N_{fin}$. Points 530 represent single finFETs devices ($N_{fin}=1$) with $\sigma D_{fin}$ of 1 nm and 2.25 nm. Points 520 represent multiple finFETs devices having 20 individual finFETs ($N_{fin}=20$) with $\sigma D_{fin}$ of 1 nm and points 510 represent multiple finFETs devices (where $N_{fin}=20$) with $\sigma D_{fin}$ of 2.25 nm. Area 540 highlights a section of the graph where points 520 are predominantly located. As shown, points 510 are dispersed widely, while points 520 are located closer to the line described by points 530.

The SS influences the transition between states (either off or on). Thus, multiple finFETs devices with high $\sigma D_{fin}$ (such as those represented by points 510) may experience greater variation in transitions between states then such devices having less variation in $D_{fin}$.

Rather than using a statistical circuit analysis using multiple discrete compact models for individual fins (where each fin has an independent statistical variation), various exemplary embodiments fit existing compact model to a nominal single fin I-V characteristics.

The general form of $V_{th}$ variation may be given as follows:

$$\sigma_{V_{th}}^2 = \sum_i \left(\frac{\partial V_{th}}{\partial p_i}\sigma_{P_i}\right)^2 \sim \left(\frac{\partial V_{th}}{\partial L_g}\sigma_{L_g}\right)^2 + \left(\frac{\partial V_{th}}{\partial H_{fin}}\sigma_{H_{fin}}\right)^2 + \tag{2}$$

$$\left(\frac{\partial V_{th}}{\partial D_{fin}}\sigma_{D_{fin}}\right)^2 + \left(\frac{\partial V_{th}}{\partial T_{ox}}\sigma_{T_{ox}}\right)^2 + \left(\frac{\partial V_{th}}{\partial N_{ch}}\sigma_{N_{ch}}\right)^2 + \left(\frac{\partial V_{th}}{\partial \Phi_g}\sigma_{\Phi_g}\right)^2,$$

where $p_i$ is a general statistical variable, $L_g$ is gate length, $H_{fin}$ is fin height, $D_{fin}$ is fin thickness, $T_{ox}$ is effective gate dielectric thickness, $N_{ch}$ is channel doping (which is negligible for a fully depleted fin), and $\Phi_g$ is gate work function.

For DIBL, significant inter-fin sources of variation can be written using a Pelgrom-like form:

$$\Rightarrow \sigma_{V_{th,lin}}^2 - \sigma_{V_{th,sat}}^2 = \sigma_{V_{th,DIBL}}^2 \sim \frac{1}{\text{Area}_{channel}} \sim \frac{1}{2L_g H_{fin} N_{fin}} \tag{3}$$

$$\Rightarrow \sigma_{V_{th,DIBL}} \sim \frac{\text{constant}}{\sqrt{N_{fin}}}.$$

In a first exemplary embodiment, a compact model (such as a BSIM-CMG model, a BSIMSOI model, etc. for example) may be fit to nominal single fin I-V characteristics. Next statistical data is obtained (such as measurement data of hardware or simulation data for example). A single parameter statistical model (such as an off voltage ($V_{OFF}$) statistical model for example) is used to fit $I_{off}$ variation in the statistical data based on the relationship between DIBL and SS (as seen in FIG. 1). A model (such as, in a non-limiting example, a second-order polynomial model) is generated (such as where $$VOFF = A + \frac{B1}{\sqrt{N_{fin}}} + \frac{B2}{N_{fin}}$$

for example). The model is then used to fit $V_{OFF}$ to the statistical data.

The first exemplary embodiment may also include fitting $I_{on}$ using mobility (such as a $\mu_o$ model parameter for example) and/or series resistance (such as a rdsw model parameter for example). The exemplary embodiment may also include fitting gate capacitance ($C_{gate}$) using a I-V to C-V threshold adjust parameter (such as a delvt parameter for example).

Figure 6:
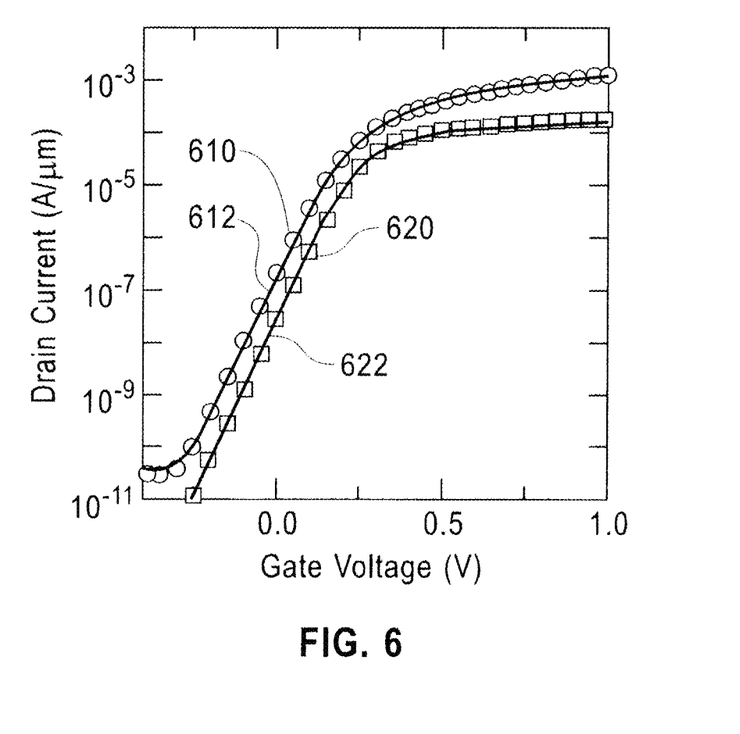
FIG. 6 displays comparisons of gate voltage to drain current.

FIG. 6 displays comparisons of gate voltage vs. drain current for one-fin finFET devices biased at different Vds. Points 610 represent data measured from single finFET devices having a $V_{ds}$ of 0.9 V and points 620 measured from single finFET devices having a $V_{ds}$ of 0.05 V. Lines 612 and 622 illustrate compact models (such as BDIM-CMG, BSIMSOI, etc. for example) which have been fit to nominal single fin characteristics. Line 612 has been fit to points 610 and line 622 has been fit to points 622.

Figure 7:
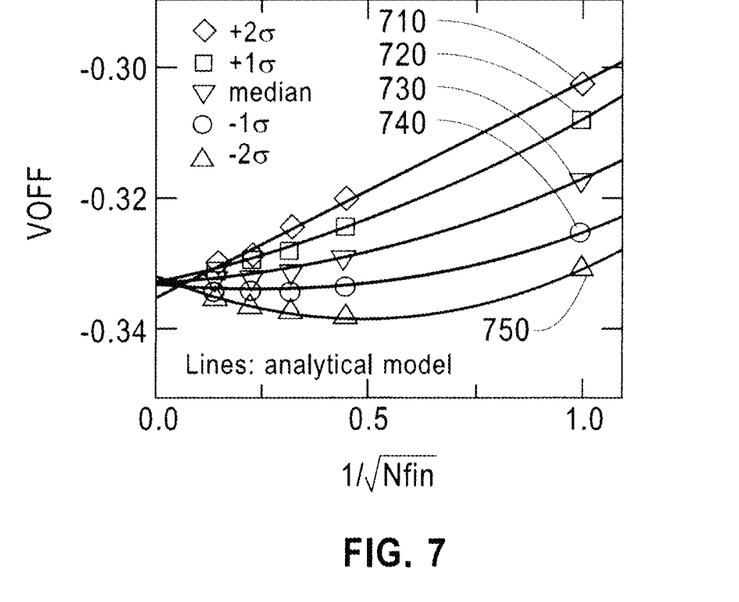
FIG. 7 shows the results of fitting a second-order polynomial analytical model to statistical data.

FIG. 7 shows results of fitting a second-order polynomial analytical model to statistical data as performed in the first exemplary embodiments. Various curves 710, 720, 730, 740 and 750 are shown for analytical models which are fit to various corners. Curve 730 shows an analytical model which has been fit to the median deviation.

Figure 8:
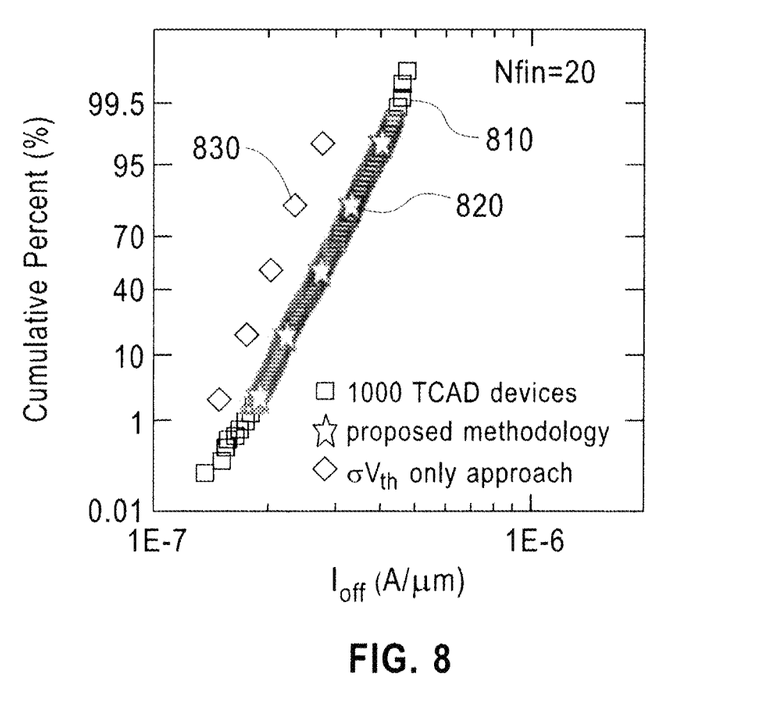
FIG. 8 illustrates a complete $I_{off}$ fitting in accordance with an exemplary embodiment.

FIG. 8 illustrates a complete $I_{off}$ fitting in accordance with the first exemplary embodiment. Points 810 illustrate results from multiple simulations. Points 820 illustrate the results from a model generated in accordance with this invention. Points 820 match closely with the curve described by points 810.

In contrast, points 830 illustrate the results of a conventional approach using variation in $V_{th}$ only. While points 830 reflect a curve that is similar to that described by points 820, points 820 provide a more accurate Ioff prediction Reference is made to FIG. 10 for illustrating a simplified block diagram of various electronic devices and apparatus that are suitable for use in practicing exemplary embodiments. For example, computer 1010 may be used to control a lithography process in accordance with an exemplary embodiment.

Figure 10:
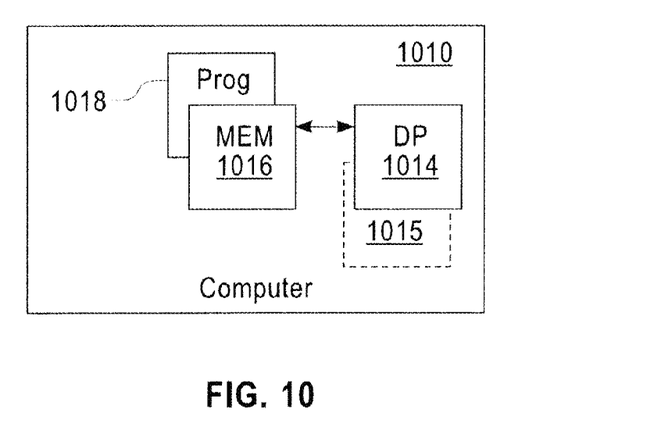
FIG. 10 shows a simplified block diagram of an exemplary electronic device that is suitable for use in practicing various exemplary embodiments.

The computer 1010 includes a controller, such as a computer or a data processor (DP) 1014 and a computer-readable memory medium embodied as a memory (MEM) 1016 that stores a program of computer instructions (PROG) 1018.

The PROGs 1018 is assumed to include program instructions that, when executed by the associated DP 1014, enable the device to operate in accordance with exemplary embodiments, as will be discussed below in greater detail.

That is, various exemplary embodiments may be implemented at least in part by computer software executable by the DP 1014 of the computer 1010, or by hardware, or by a combination of software and hardware (and firmware).

The computer 1010 may also include dedicated processors, for example FinFET modeling processor 1015.

The computer readable MEM 1016 may be of any type suitable to the local technical environment and may be implemented using any suitable data storage technology, such as semiconductor based memory devices, flash memory, magnetic memory devices and systems, optical memory devices and systems, fixed memory and removable memory. The DP 1014 may be of any type suitable to the local technical environment, and may include one or more of general purpose computers, special purpose computers, microprocessors, digital signal processors (DSPs) and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

Based on the foregoing it should be apparent that various exemplary embodiments provide a method, apparatus and computer program(s) for accurate modeling of inter-fin variation of fin thickness variation.

Figure 11:
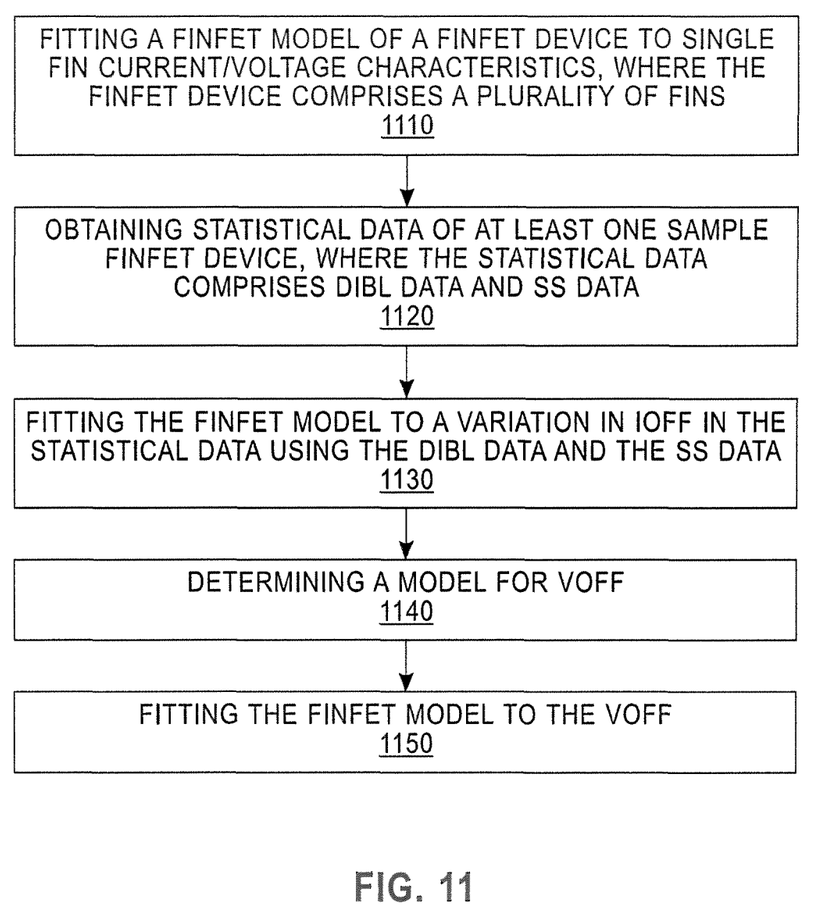
FIG. 11 is a logic flow diagram that illustrates the operation of an exemplary method, and a result of execution of computer program instructions embodied on a computer readable memory, in accordance with various exemplary embodiments.

FIG. 11 is a logic flow diagram that illustrates the operation of a method, and a result of execution of computer program instructions (such as PROG 1018), in accordance with exemplary embodiments. In accordance with these exemplary embodiments a method performs, at Block 110, a step of fitting a FinFET model of a FinFET device to single fin current/voltage characteristics. The FinFET device includes a plurality of fins. The method performs, at Block 11120, a step of obtaining statistical data of at least one sample FinFET device. The statistical data includes DIBL data and SS data. At Block 1130, the method performs a step of fitting the FinFET model to a variation in a current to turn off the finFETs device ($I_{OFF}$) in the statistical data using the DIBL data and the SS data. The method performs, at Block 1140, a step of determining a model for a voltage to turn off the finFETs device ($V_{OFF}$). The method also performs, at Block 150, a step of fitting the FinFET model to the $V_{OFF}$.

As shown in the first exemplary embodiment, the relationship between DIBL and SS may be used as a correlating component in a variability model. This relationship may also be used as a metric of variability.

In another exemplary embodiment, DIBL-SS statistical data is obtained for example by inline tests during manufacturing. A single parameter statistical model (such as $V_{OFF}$ statistical model for example) is used to define a product fitness metric for $D_{fin}$ based on the relationship between DIBL and SS. The $V_{OFF}$ parameter changes subthreshold behavior but not on-state behavior. A first set of guard bands is selected for DIBL based on a product performance metric (such as a ring oscillator delay for example). A second set of guard bands is selected for SS based on a product power metric (such as leakage current for example). The sets of guard bands may then be used to screen the DIBL-SS statistical data. Based on the screening, an analysis of product quality may be provided (for example, where values falling within the guard bands are deemed acceptable).

The guard bands may be set based on past measured data, simulations (such as TCAD, SPICE, or mixed mode TCAD/SPICE for example), or by a user (such as based on extrapolation from past technology nodes). Some factors for setting guard bands include basic device design parameters (such as nominal Fin thickness and other physical design specifications for example) and the expected device electrical performance specifications.

In a further exemplary embodiment, addition parameters (such as gate length for example) may be selected. These parameters may then be used for further screening the DIBL-SS statistical data by filtering the DIBL-SS statistical data at targeted gate length.

Figure 9:
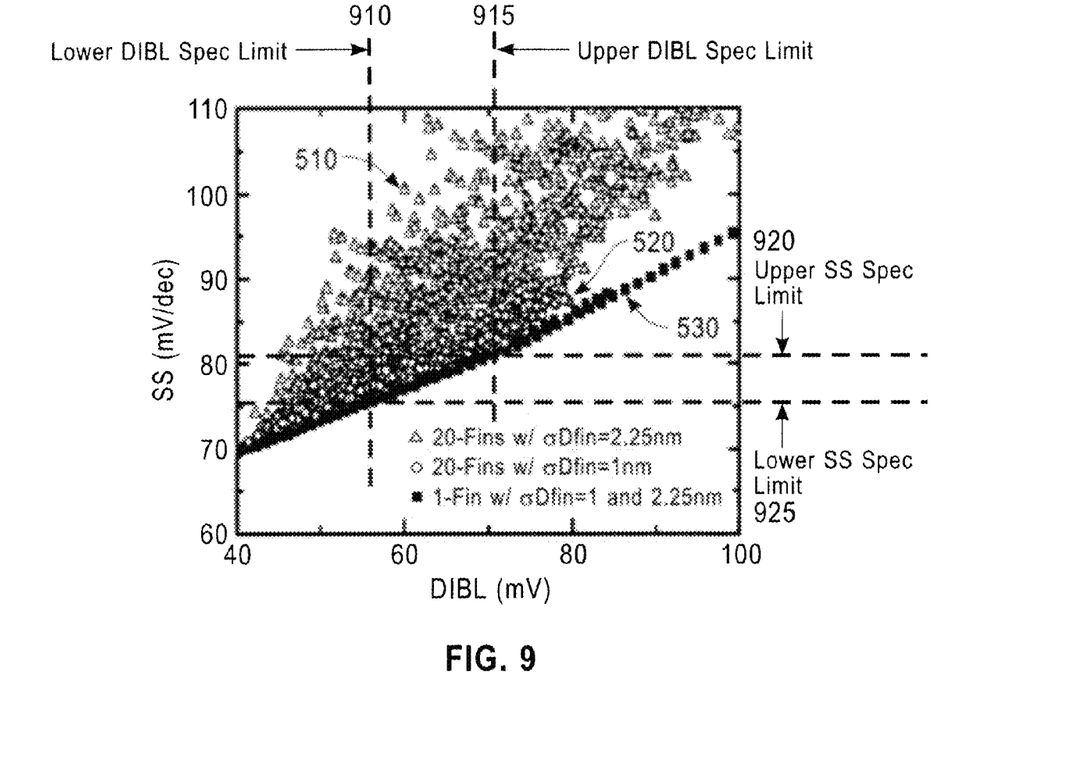
FIG. 9 demonstrates the DIBL vs. SS of various devices with different $N_{fin}$ and variations in $D_{fin}$ and also demonstrates various boundary limits.

FIG. 9 demonstrates the DIBL vs. subthreshold slope (SS) of various devices with different variation in $D_{fin}$ ($\sigma D_{fin}$) and $N_{fin}$ as shown in FIG. 5. Additionally, FIG. 9 demonstrates various boundary conditions. Limits may be placed on the DIBL (910, 915) and on the SS (920, 925) in order to define in-line test results which would be considered passing (that the device specification is acceptable).

Figure 12:
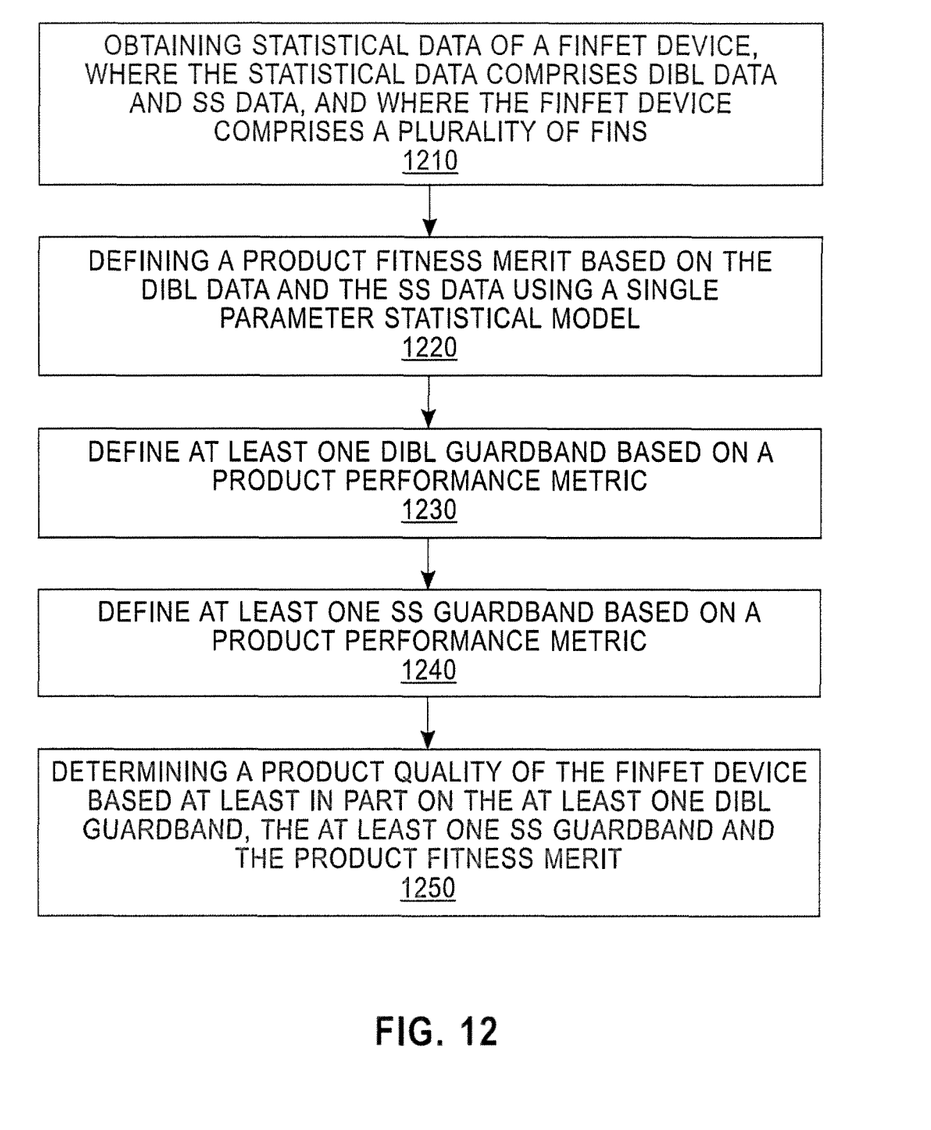
FIG. 12 is a logic flow diagram that illustrates the operation of another exemplary method, and a result of execution of computer program instructions embodied on a computer readable memory, in accordance with various exemplary embodiments.

FIG. 12 is a logic flow diagram that illustrates the operation of a method, and a result of execution of computer program instructions (such as PROG 1018), in accordance with exemplary embodiments. In accordance with these exemplary embodiments a method performs, at Block 1210, a step of obtaining statistical data of a FinFET device. The statistical data includes DIBL data and SS data. The FinFET device includes a plurality of fins. The method performs, at Block 1220, a step of defining a product fitness merit based on the DIBL data and the SS data using a single parameter statistical model. At Block 1230, the method performs a step of defining at least one DIBL guardband based on a product performance metric, and, at Block 1240, the method performs a step of defining at least one SS guardband based on a product performance metric. The method also performs, ay Block 1250, a step of determining a product quality of the FinFET device based at least in part on the at least one DIBL guardband, the at least one SS guardband and the product fitness merit.

The various blocks shown in FIGS. 11 and 12 may be viewed as method steps, and/or as operations that result from operation of computer program code, and/or as a plurality of coupled logic circuit elements constructed to carry out the associated function(s).

Any use of the terms "connected", "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out various exemplary embodiment. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. An article of manufacture tangibly embodying a non-transitory computer readable medium containing instructions which, when executed by a computer, cause the computer to carry out steps of a method for modeling fin field effect transistor (FinFET) width quantization comprising:
fitting points of a curve representing a FinFET model of a FinFET device to points of a curve representing single fin current and voltage characteristics, where the FinFET device comprises a plurality of fins;
obtaining statistical data of sample FinFET devices, where the statistical data comprises drain induced barrier lowering (DIBL) data and subthreshold slope data; and
fitting the FinFET model to a variation in a current to turn off the FinFET devices ($I_{off}$) in the statistical data using the DIBL data and the subthreshold slope data, where fitting the FinFET model comprises determining a model for a FinFET devices turn-off voltage parameter, $V_{OFF}$, where the $V_{OFF}$ parameter changes subthreshold behavior but not on-state behavior.

2. The article of manufacture as in claim 1, where the statistical data is one of: measured data and simulation data.

3. The article of manufacture as in claim 1, where the model satisfies the equation:

$$V_{OFF} = A + \frac{B1}{\sqrt{N_{fin}}} + \frac{B2}{N_{fin}},$$

where A, B1 and B2 are constants, and $N_{fin}$ is a number of individual fins in the FinFET device.

4. The article of manufacture of claim 1, where the steps of the method further comprise fitting a current to turn on the finFETs device ($I_{on}$) using at least one of: a mobility parameter and a series resistance parameter.

5. The article of manufacture of claim 1, further comprising:
defining a product fitness merit based on the DIBL data and the subthreshold slope data using a single parameter statistical model;
defining at least one DIBL guardband based on a product performance metric;
defining at least one subthreshold slope guardband based on a product performance metric; and
determining a product quality of the FinFET device based at least in part on the at least one DIBL guardband, the at least one subthreshold slope guardband and the product fitness merit.

6. The article of manufacture of claim 5, where the product performance metric is a ring oscillator delay.

7. The article of manufacture of claim 5, where the product power metric is a leakage current.

8. The article of manufacture of claim 5, further comprising developing at least one screen condition, where the at least one screen condition comprises Lpoly.

9. The article of manufacture of claim 8, where determining the product quality of the FinFET device is further based on the at least one screen condition.

\* \* \* \* \*